United States Patent [19]
Hoegler

[11] Patent Number: 5,422,578
[45] Date of Patent: Jun. 6, 1995

[54] MAGNETIC RESONANCE PROBEHEAD

[75] Inventor: Miro Hoegler, Karlsruhe, Germany

[73] Assignee: Bruker Medizintechnik GmbH, Rheinstetten-Forchheim, Germany

[21] Appl. No.: 265,570

[22] Filed: Jun. 24, 1994

Related U.S. Application Data

[63] Continuation of Ser. No. 910,233, Jul. 8, 1992, abandoned.

[30] Foreign Application Priority Data

Jul. 10, 1991 [DE] Germany ............ 41 22 797.2

[51] Int. Cl.⁶ ............................................. G01R 33/20
[52] U.S. Cl. ................................................ 324/318
[58] Field of Search ............... 324/316, 318, 322, 300; 335/282, 301, 296

[56] References Cited

U.S. PATENT DOCUMENTS

| | | | |
|---|---|---|---|
| 4,446,429 | 5/1984 | Froncisz et al. | 324/316 |
| 4,621,237 | 11/1986 | Timms | 324/322 |
| 4,636,730 | 1/1987 | Bottomley | 324/318 |
| 4,641,097 | 2/1987 | Bottomley et al. | 324/318 |
| 4,758,789 | 7/1988 | Ono et al. | 324/318 |
| 5,063,384 | 11/1991 | Reits | 342/359 |
| 5,210,494 | 5/1993 | Brunner et al. | 324/307 |

FOREIGN PATENT DOCUMENTS 0005160 1/1987 Japan ................. 324/318

*Primary Examiner*—Sandra L. O'Shea
*Assistant Examiner*—Raymond Y. Mah
*Attorney, Agent, or Firm*—Claude A. S. Hamrick

[57] ABSTRACT

A magnetic resonance probehead is disclosed comprising a split-ring coil having a ring-shaped coil body with an axial slot therein. A radio-frequency (RF) measuring field is generated within the coil body and directed in parallel to a body axis. The coil body defines a first radial plane on one axial side and a second radial plane on the opposite axial side thereof. A measuring object is surface-contacted to the first radial plane whereas an electrical mirror having an RF-conductive plate is arranged in parallel to the second radial plane and at a predetermined axial distance therefrom.

17 Claims, 4 Drawing Sheets

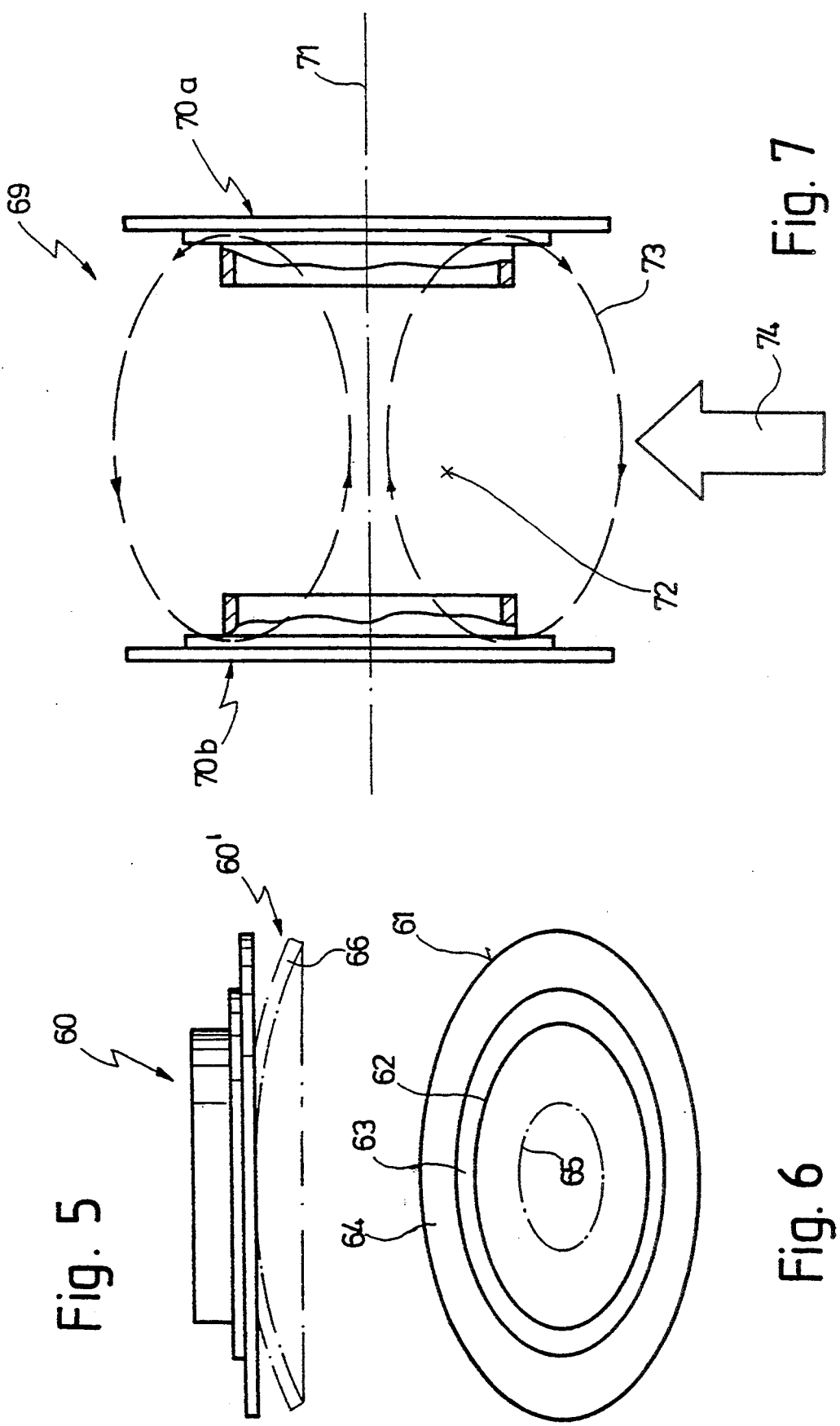

MAGNETIC RESONANCE PROBEHEAD

This is a continuation of application(s) Ser. No. 07/910,233, filed on Jul. 8, 1992, now abandoned.

BACKGROUND OF THE INVENTION

1. Field of the Invention

The present invention relates to a coil arrangement for measurements using magnetic resonance, especially nuclear magnetic resonance, having at least one coil configured as an axially slotted ring, for generating and/or receiving a HF measuring field extending substantially in parallel to the coil axis, the measuring object being located in a measuring space adjoining a first radial plane of the coil.

2. Description of the Prior Art

A coil arrangement of the before-described type has been known from U.S. Pat. No. 4,866,387.

The known coil arrangement, usually described as "CRC coil" (CRC=Counter Rotating Currents), consists essentially of two rings, which are arranged coaxially and at an axial distance relative one to the other and which are provided with one axial slot each at aligned circumferential positions. In the area of their axial slots, the two rings are designed as capacitors, for example in such a way that a copper strip constituting the ring is bent over in this area in radial direction in the form of two parallel legs.

The known coil arrangement may be operated in a basic oscillating mode in which the field lines of a magnetic alternating field pass through both coils. However, the coil arrangement may also be operated in a second, higher-frequency oscillating mode in which the HF currents flow in opposite senses in the circumferential direction of the two rings. The before-mentioned field lines will then pass through one of the two rings only and will leave the rings in opposite axial directions.

This measure is based on the following considerations:

It has been known that coils of the type used for example for nuclear resonance measurements, whose size is selected in such a way that the wavelength of the natural resonance is in the range of the measuring frequency, have an unfavorable signal-to-noise ratio. Now, it is of course imaginable to make the coils smaller, geometrically, which would automatically reduce their inductance, and to tune the coil so received thereafter to the desired operating frequency by applying suitable capacitors. This would indeed lead to an improvement of the signal-to-noise ratio, but would have to be paid for by a simultaneous reduction of the penetration depth, which latter is a direct function of the coil diameter with surface coils used for nuclear magnetic resonance measurements. If, however, measurements are to be carried out on human bodies, penetration depths of at least 80 mm are required. This necessitates coil diameters of at least 180 mm.

On the other hand, one always endeavors in the case of nuclear magnetic resonance measurements, especially in the case of imaging methods in nuclear resonance tomography, to have the highest possible measuring frequency. In the before-mentioned example of a coil diameter of 180 mm, the limit where the natural resonance of such a coil is in the range of the operating frequency is already reached at approximately 80 MHz.

Now, it would of course be possible to reduce the inductance of such coils by producing them from broad copper strips; this has to be ruled out, however, for practical reasons since imaging nuclear resonance measurements require the insertion of strong field gradients which would induce correspondingly strong eddy currents in broad copper strips.

For example, it would be possible with the aid of a ring coil made from a copper strip of 30 mm width and a diameter of 150 mm, and using a tuning capacitor of 5 pF, to achieve a penetration depth of approximately 60 mm in no-load condition, in the frequency range of 85 MHz.

In practical measurements, however, it has to be taken into account that biological objects (human bodies), in addition to causing dielectric losses, also have the effect of stray capacitances detuning the resonance circuit. In the described example, such detuning effect may be so important that it can no longer be compensated by usual tuning measures.

In an effort to achieve higher frequencies with an unchanged coil geometry (diameter), one has made use of a trick with the before-mentioned CRC coils, which consists in exciting in a suitable way in a coil arrangement, which normally would oscillate in a low-frequency oscillating mode, a higher frequency mode— —and only that—so that a higher measuring frequency is obtained with a relatively big coil diameter.

However, it is a disadvantage of the known CRC coil arrangements that the axial dimensions are very important, due to the absolute necessity to use two ring coils. In addition, any interference, for example any load, produces its effects in both coils, including loads located on the side opposite the measuring object.

SUMMARY OF THE INVENTION

Now, it is the object of the present invention to improve a coil arrangement of the type described above in such a way that a high measuring frequency can be achieved with predetermined coil dimensions, without having to pay for this by having to accept a substantial increase in axial overall length and, thus, the additional interferences connected therewith.

This object is achieved according to the invention by the fact that a HF-conductive plate is arranged adjacent a second radial plane of the coil, opposite the first radial plane, at a predetermined axial spacing.

The object underlying the invention is fully solved in this way.

The HF-conductive plate in fact has the effect that the higher-frequency oscillation mode remains capable of propagating in the single remaining ring coil although the second ring coil, which is an absolute requirement for the known CRC arrangement, is missing. Under HF frequency aspects, this can be accounted for by the fact that the remaining single ring coil is imaged by the HF-conductive plate. Thus, the invention makes it possible, by a second trick, i.e. the before-mentioned HF imaging effect, to preserve the advantageous properties of a CRC coil, without having to accept the increase of the axial overall length inherent in such systems (necessity of a symmetrically arranged second ring coil).

In the case of the coil arrangement according to the invention, therefore, the axial overall length is increased only insignificantly, namely by a few millimeters in the frequency range of interest in the present case, it being only necessary to arrange the HF-conductive plate at a distance of a few millimeters from the second radial plane.

Further, the invention provides the considerable advantage that, there being no second ring coil, no interference can be introduced from the area of the second ring coil of known CRC arrangements. Especially, there are no dielectric loads in the area of the second coil, which are "carried along in vain" in the known CRC arrangements.

According to a particularly preferred embodiment of the invention, the coil is mounted on the HF-conductive plate by means of a non-conductive plate of predetermined thickness.

This feature provides the advantage that a compact and sturdy arrangement is obtained which also guarantees that the predetermined radial distance is adhered to.

According to another preferred embodiment of the invention, the HF-conductive plate is provided with non-conductive surface sections, in particular with holes or slots.

This feature provides the advantage that the HF-conductive plate is prevented from interacting in a disturbing way with inserted field gradients, and that in particular the propagation of alternating currents in the HF-conductive plate, due to switched gradients, is prevented or at least drastically reduced.

According to a further preferred feature, the HF-conductive plate comprises a non-conductive plate provided with a metallization.

This enables interfering interactions with switched field gradients to be further reduced, and this especially when the metallization is applied as an extremely thin layer having a thickness of, preferably, between 10 $\mu$m and 100 $\mu$m, in particular 30 $\mu$m. This extremely thin layer is absolutely sufficient for HF imaging, while at the same time it prevents, or reduces drastically, the propagation of eddy currents.

According to a further preferred feature, the HF-conductive plate projects radially beyond the coil on all sides.

This feature provides the advantage that the theoretically required infinite diameter of the HF-conductive plate can be reduced to a practicable dimension, while at the same time the imaging effect is preserved practically in full.

This is still largely the case when the HF-conductive plate is provided with a central hole, as the imaging effect is substantially preserved in this case as well.

A further embodiment of the invention is characterized by the fact that the coil exhibits a non-circular configuration in one radial plane. In addition, the coil may have a non-flat, especially convex or concave, shape relative to a radial plane.

These features offer the advantage that the coils can be adapted optimally to specific measuring problems.

According to further embodiments of the invention, the ring is provided with four equidistant slots.

This feature provides the advantage that the electric fields are distributed more advantageously since instead of passing through the interior of the ring, they will be concentrated in the area of the four capacitors employed for bridging the slots.

According to a first group of embodiments of the invention, the coil arrangement comprises a single coil acting as a surface coil, the first radial plane forming a contact plane. According to a second group of embodiments, in contrast, the coil arrangement comprises two axially spaced coils whose first radial planes define the measuring space on both sides.

The first-mentioned group of embodiments provides the advantage that while the axial overall length is kept extremely small, a surface coil with great penetration depth is obtained, compared with the known CRC coils, the axial overall length being reduced to less than half their length.

In the case of the second group of embodiments, in contrast, less importance is placed on the axial radial length since the coil arrangement is not employed as surface coil, but is used for "scanning" part of a body from both sides.

Finally, special preference is given to an embodiment of the invention where the coil has a diameter of between 150 mm and 250 mm, preferably 180 mm, and the measuring frequency is between 70 MHz and 120 MHz, preferably 85 MHz.

These dimensions have been found in practice to be of particular advantage.

Other advantages of the invention will appear from the specification and the attached drawing.

It is understood that the features that have been mentioned before and that will be described hereafter may be used not only in the stated combinations, but also in any other combination or each alone, without departing from the scope of the present invention.

BRIEF DESCRIPTION OF THE DRAWINGS

Some embodiments of the invention will now be described in more detail with reference to the drawing in which

FIGS. 5 and 6 show a side view and a top view, respectively, of another embodiment of a coil arrangement according to the invention; and FIG. 7 shows a side view of still another embodiment of the invention.

DESCRIPTION OF THE PREFERRED EMBODIMENTS

Figure 2:
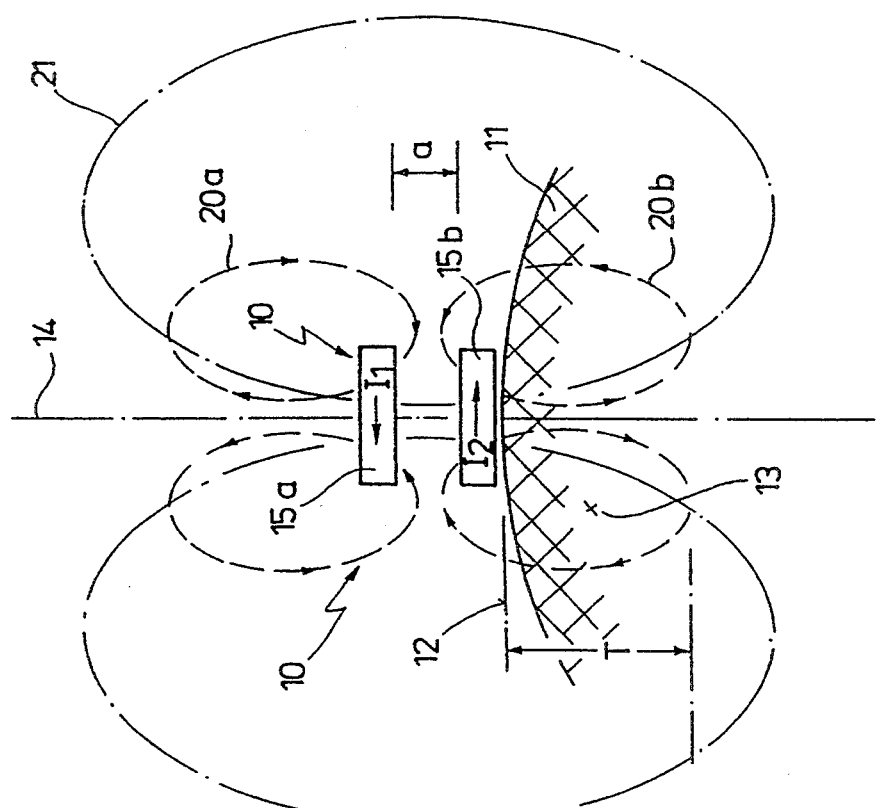
FIG. 2 shows a diagrammatic axial section through the arrangement illustrated in FIG. 1, including the field lines encountered in this case.
Figure 1:
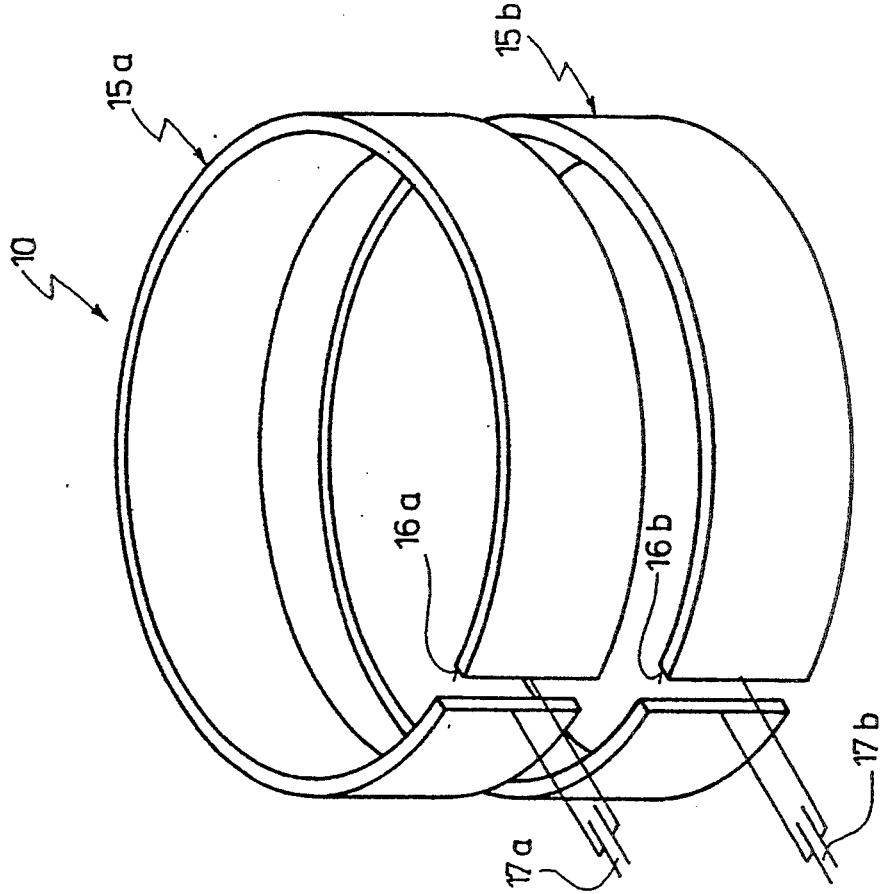
FIG. 1 shows a perspective view of what is known as CRC coil arrangement according to the prior art.

In FIGS. 1 and 2, reference numeral 10 indicates a surface coil of known design, usually described as "CRC coil" (CRC=Counter Rotating Currents).

One axial side of the surface coil 10 may be applied, by one contact plane 12, on a body 11 or, generally speaking, on a measuring object. The contact plane 12 defines in this case one side of a measuring space 13 which accommodates the measuring object.

The surface coil 10 is arranged symmetrically relative to a longitudinal axis 14. It comprises two rings 15a, 15b arranged coaxially one to the other and provided each with a slot 16a, 16b arranged in identical positions on the respective circumferences. The slots 16a, 16b are bridged by capacitors 17a, 17b. The capacitors 17a, 17b may be designed either as separate components or as radially bent-off portions of the copper strip forming the rings 15a, 15b.

Regarding now FIG. 2, field lines of the HF alternating field of the coil 10 are indicated by 20a, 20b. The field lines 20a, 20b pass through each of the two coils in the form of rings 15a, 15b, thus developing in opposite senses relative to the axis 14. This means that the surface currents $I_1$ and $I_2$ in the rings 15a, 15b must of course be oppositely directed, as can be seen clearly in FIG. 2.

The rings 15a, 15b are arranged at an axial spacing a, and the depth of penetration into the measuring object 11 is indicated by T in FIG. 2.

Reference numeral 21 designates further field lines characterizing a lower-frequency basic mode of the coil 10. If excited in a suitable way, the surface coil 10 would oscillate in this basic mode with the field lines 21, which latter would pass the two rings 15a, 15b jointly. The frequency of the basic mode with the field lines 21 is, however, substantially lower than the frequency of the higher-frequency mode with the field lines 20a, 20b. Considering, however, that the highest possible measuring frequency is desired for a predetermined coil geometry, in particular for a predetermined diameter of the rings 15a, 15b, excitation with oppositely directed currents $I_1$ and $I_2$, as illustrated in FIG. 2, is selected for a CRC coil arrangement, whereby the higher-frequency oscillation mode with the field lines 20a, 20b is obtained.

However, one also sees in FIG. 2 that the axial overall length of the surface coil 10 is relatively big, being determined not only by the two broad rings 15a, 15b, but additionally by the axial distance a.

Figure 3:
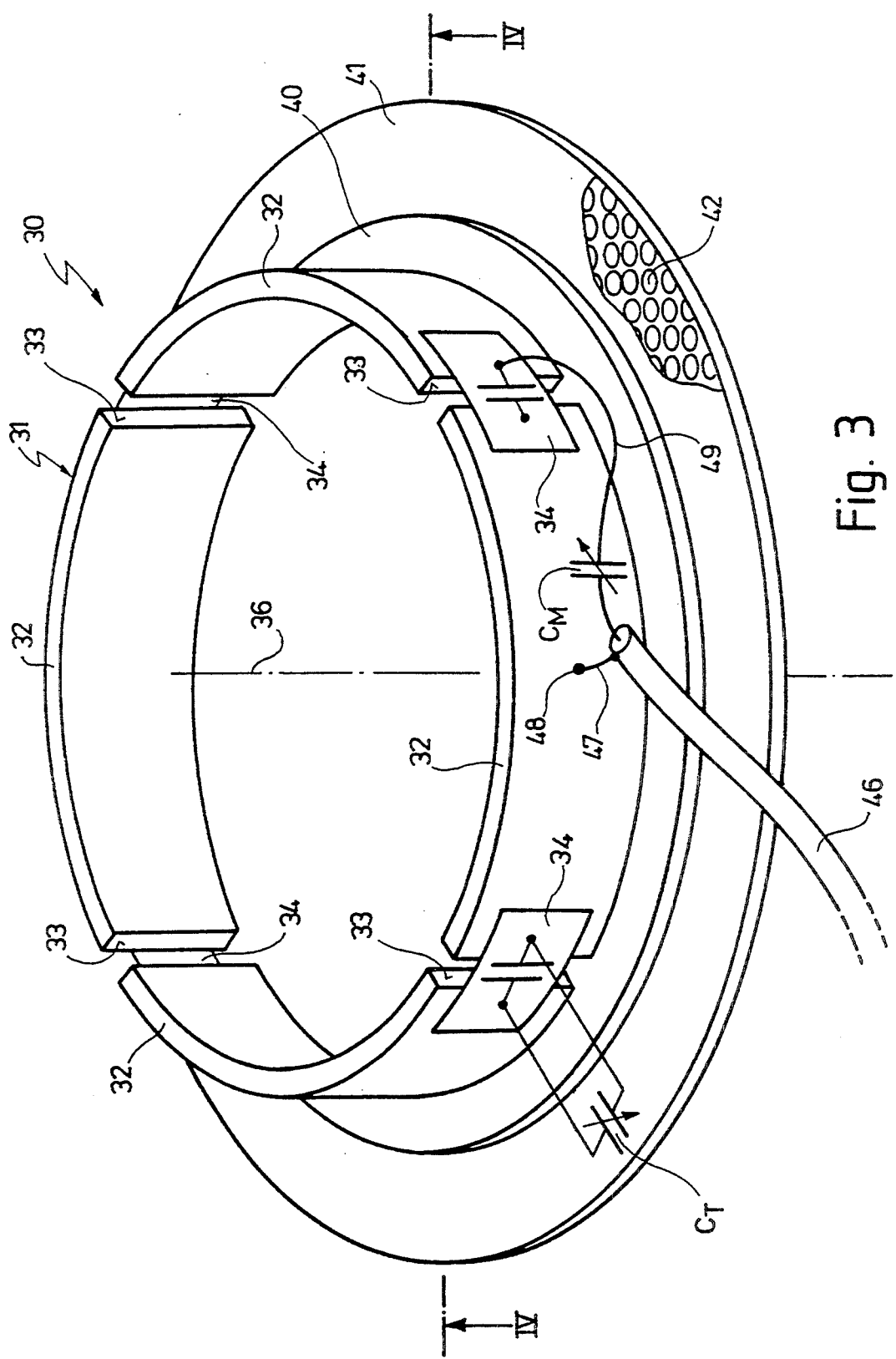
FIG. 3 shows a perspective view of a first embodiment of a coil arrangement according to the invention.
Figure 4:
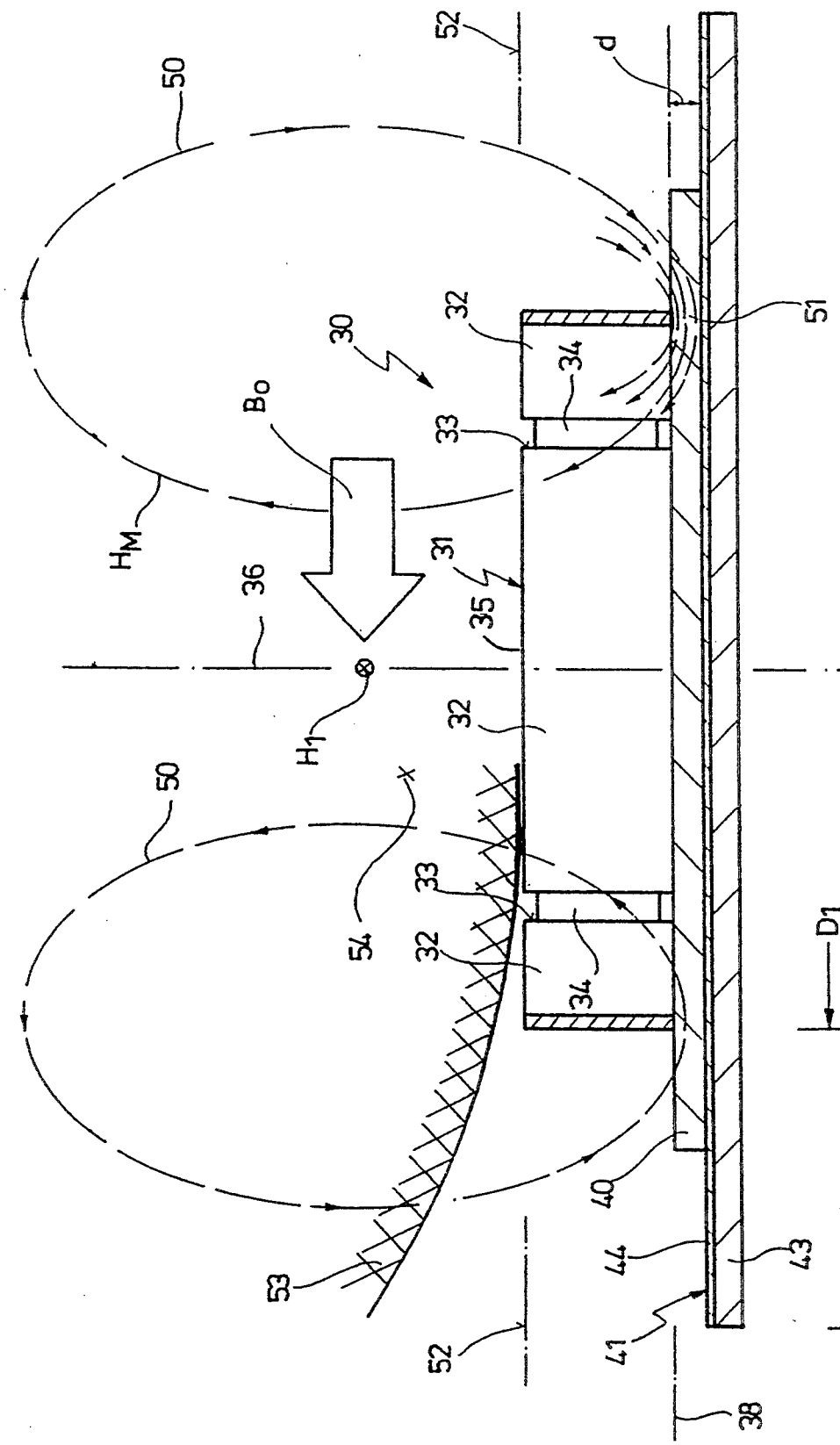
FIG. 4 shows an axial section along line IV—IV in FIG. 3.

FIGS. 3 and 4 now illustrate a first embodiment of the invention.

The surface coil designated generally by 30 consists substantially of a ring 31 which is subdivided into four segments 32 of equal length, separated by slots 33. The slots 33 are bridged by capacitors 34. This measure, which is known as such, serves the purpose to geometrically define the HF electric field, which otherwise would pass through the interior of the ring 31 and would lead to dielectric losses in the measuring object, to the capacitors 34.

The ring 31 is disposed concentrically relative to an axis 36.

Now, the surface coil 30 differs from the arrangements of the prior art firstly by the fact that a single ring only is provided. Another particularity resides in the fact that the lower radial plane 38 of the ring 31—as viewed in FIGS. 3 and 4—rests on a plastic plate 40 of a predetermined thickness d, the plastic plate 40 being followed at its bottom by a HF-conductive plate 41. As can be clearly seen in FIG. 3, the HF-conductive plate 41 preferably is provided with holes 42. However, instead of the holes 42, it is also possible to provide slots, or the like.

In view of the required stability, the HF-conductive plate 41 preferably consists of a plastic plate 43 carrying a metallization 44 adjoining the first-mentioned plastic plate 40.

FIG. 3 shows that the surface coil 30 is supplied via a HF coaxial cable 46. The screening jacket of the cable 46 is connected, via a grounding line 47, to a connection point 48 located, at least approximately, in the center of one of the segments 32 of the ring 31. The signal line 49 of the coaxial cable 46, in contrast, is run to the neighboring segment 32 and there to the adjoining connection of the capacitor 34.

As is illustrated in FIG. 3, a matching capacitor $C_M$, preferably a tunable capacitor, can be connected into the signal line 49. Correspondingly, the capacitors 34 can be bridged by, preferably likewise tunable, tuning capacitors $C_T$.

It is thus possible to adapt the surface coil 10 to a signal source by means of a capacitor $C_M$ (matching) or to the operating frequency by means of the capacitors $C_T$ (tuning).

It goes without saying that these considerations apply irrespective of whether the surface coil 30 is used as transmitter coil, as receiver coil, or as combined transmitter/receiver coil.

Now, when the surface coil 30 is supplied with a HF signal of suitable frequency, then the conditions illustrated in detail in FIG. 4 will be obtained.

Reference numeral 50 in FIG. 4 indicates the field lines of the HF field which is at the same time the measuring field $H_M$ for nuclear resonance measurements. The field lines 50 surround the ring 31, their propagation is, however, limited by the metallization 44.

This has the result that an area of denser field line distribution 51 develops between the lower HF-conductive ring 31 and the metallization 44. The area of denser field line distribution 51 is defined by the thickness d of the plastic plate 40. The thickness d, therefore, is one of the determining parameters of the surface coil 30. The thickness d is defined on top by the desired limited axial overall length. At the bottom, it is defined by the fact that the denser field lines 50 result in a threshold value below which the arrangement is no longer capable of oscillating. In practice (frequencies in the range around 85 MHz), the thickness d is equal to some millimeters.

Opposite the lower radial plane 38 of the ring 31, one can see an upper radial plane 52 defined by the upper surface 35 of ring 31 and which, in the measuring example illustrated in FIG. 4, forms simultaneously the contact plane and contact surface of the coil 30. The contact plane 52 can be applied upon a measuring object 53 located in a measuring space above the plane 52.

When carrying out nuclear magnetic resonance measurements, the field lines 50 of the HF measuring field $H_M$, therefore, pass through the measuring object 53 in a direction parallel to the axis 36. In contrast, the HF excitation field, usually designated by $H_1$, extends in a direction perpendicular to the drawing plane of FIG. 1, and the homogenous constant magnetic field, usually designated $B_O$, extends in parallel to the drawing plane of FIG. 4, but perpendicularly to the axis 36. It is thus possible to carry out nuclear magnetic resonance measurements, in particular imaging tomography measurements, in the manner known as such. Further details in this connection may be taken, for example, from the German book by Hauser, K.H., entitled "NMR fur Mediziner und Biologen" Springer-Verlag, 1989, especially pages 180 et seq...

FIG. 4 shows clearly that the axial overall length of the surface coil 30 is notably smaller than that of known CRC coil arrangements according to FIGS. 1 and 2. In particular, it has been found in practice that the axial overall length of the components 40, 43, 44 illustrated below the ring 31 in FIG. 4 is even smaller than half the distance a between the individual coils of a known CRC coil arrangement (compare FIG. 2). The illustration, in particular FIG. 4, is of course not true to scale, the parameter d being in practice approximately one order of magnitude smaller than the axial overall length of the ring 31.

In a practical example, one produced at first an axially slotted ring coil without an adjoining HF-conductive plate. The ring coil had a diameter of 180 mm and consisted of a copper strip of 35 mm width. The ring was provided with four axial slots. With the aid of tuning capacitors having a capacitance value of 2.2 pF it was possible to tune the coil to an operating frequency of 85 MHz in the no-load condition.

When this coil was approached to a biological measuring object (human body), the resonance frequency of 85 MHz dropped to 78 MHz, and the Q factor dropped to approximately 5. As a result of this detuning, renewed tuning to operating frequency was no longer possible.

Adding a HF-conductive plate (film) at a distance d of 3 mm led to a shift in the no-load resonance frequency from 85 MHz to 130 MHz (without tuning capacitors). By providing larger tuning capacitors of 25 pF, the resonance frequency could be tuned again to 85 MHz. The no-load Q factor was equal to 150. This no-load Q factor dropped to 40 when the coil was approached to the measuring object, while the resonance frequency varied only by 0.5 MHz, and this could be compensated easily by tuning.

After the operating frequency of 85 MHz had been adjusted again, a penetration depth of 80 mm could be verified.

FIGS. 5 and 6 show a side view and a top view, respectively, of another surface coil 60 whose non-circular shape 61 can be clearly seen in FIG. 6. The term non-circular shape is meant to describe an elliptic shape (as shown), or an approximately square or rectangular, or any other shape.

This shape finds its expression in particular in the radial form of the ring 62, the plastic plate 63 and the HF-conductive plate 64.

Reference numeral 65 indicates that the interior of the ring 62 may be provided also with an opening, or a substantially full-length slot, if this should be convenient for specific experiments.

Reference numeral 66 in FIG. 5 indicates a further embodiment 60' of a surface coil where the surface coil 60' exhibits a non-flat, for example a convex or concave, shape relative to the radial plane.

It is thus possible, by selecting a convenient shape, to adapt the system to specific measuring tasks.

Finally, FIG. 7 shows an embodiment of the invention where a coil arrangement 69 consists of two surface coils 70a, 70b having a configuration similar to that of the surface coils 30 in FIGS. 3 and 4.

The surface coils 70a and 70b are arranged coaxially to a common axis 71 and with their rings facing each other. The space 72 so formed serves as measuring space and is passed by the—now common—field lines 73 surrounding the two rings of the surface coil 70a, 70b.

By 74 it is indicated that in this case a measuring object may be introduced into the space 72 from the side. The coil arrangement 69 according to FIG. 7, therefore, enables examinations to be carried out for example on human limbs, such as a hand, a knee, or the like.

I claim:

1. A magnetic resonance surface coil probehead, comprising:
    a split-ring coil, having a ring-shaped coil body with a body axis and at least one axial slot in said coil body, for generating or receiving a magnetic radio-frequency (RF) measuring field ($H_M$), said measuring field ($H_M$) being directed essentially in parallel to said body axis within said coil body, said coil body having surfaces defining a first radial plane on one axial side of said coil body and a second radial plane on the opposite axial side of said coil body, the surface of said coil body defining said first radial plane also forming contact means for contacting a surface of a measuring object disposed in a measuring space thereabove; and
    electrical image means comprising an RF-conductive plate limiting propagation of said magnetic radio-frequency (RF) measuring field ($H_M$) and being arranged in parallel to said second radial plane and at a predetermined axial distance (d) therefrom.

2. The probehead according to claim 1, wherein said coil body is mounted on said RF-conductive plate by means of a non-conductive plate of predetermined thickness (d).

3. The probehead according to claim 1, wherein said RF-conductive plate is provided with non-conductive surface sections.

4. The probehead according to claim 3, wherein said non-conductive surface sections are configured as holes or slots.

5. The probehead according to claim 1, wherein said RF-conductive plate comprises a non-conductive base plate provided with a metallization layer.

6. The probehead according to claim 5, wherein said metallization layer has a thickness of between 10 $\mu$m and 100 $\mu$m.

7. The probehead according to claim 6, wherein said thickness is 30 $\mu$m.

8. The probehead according to claim 1, wherein said RF-conductive plate projects radially beyond said coil body on all sides thereof.

9. The probehead according to claim 1, wherein said RF-conductive plate is provided with a central hole.

10. The probehead according to claim 1, wherein said coil body has a non-circular configuration in a radial plane.

11. The probehead according to claim 1, wherein said coil body has a non-flat shape relative to a radial plane.

12. The probehead according to claim 11, wherein said shape is convex or concave.

13. The probehead according to claim 1, wherein said coil body is provided with four equidistant slots.

14. The probehead according to claim 1, comprising one single coil body.

15. The probehead according to claim 1, wherein said coil body has a diameter of between 150 mm and 250 mm, and the measuring frequency is between 70 MHz and 120 MHz.

16. The probehead according to claim 15, wherein said diameter is 180 mm and said measuring frequency is 85 MHz.

17. A magnetic resonance probehead, comprising:
    a first split-ring coil having a first ring-shaped coil body with a first body axis and at least one axial slot in said first coil body, for generating or receiving a magnetic radio-frequency (RF) measuring field ($H_M$), said measuring field being directed essentially in parallel to said first body axis within said first coil body, said first coil body defining a first radial plane on one axial side of said first coil body and a second radial plane on the opposite axial side of said first coil body;
    a second split-ring coil having a second ring-shaped coil body with a second body axis and at least one axial slot in said second coil body, for generating or receiving a magnetic radio-frequency (RF) measuring field ($H_M$), said measuring field being directed essentially in parallel to said second body axis within said second coil body, said second coil body defining a third radial plane on one axial side of said second coil body and a fourth radial plane on the opposite axial side of said second coil body, said second split-ring coil being arranged coaxially and at a distance to said first split-ring coil with said first radial plane facing said third radial plane;

first electrical mirror image means comprising a first RF-conductive plate limiting propagation of said magnetic radio-frequency (RF) measuring field ($H_M$) and being arranged in parallel to said second radial plane and at a predetermined axial distance (d) therefrom away from said first coil body;

second electrical image means comprising a second RF-conductive plate limiting propagation said magnetic radio-frequency (RF) measuring field ($H_M$) and being arranged in parallel to said fourth radial plane and at a predetermined axial distance (d) therefrom away from said second coil body; and support means for supporting a measuring object between said first and said third annular surfaces.

* * * * *